United States Patent
Tan et al.

(10) Patent No.: US 12,265,723 B2
(45) Date of Patent: Apr. 1, 2025

(54) PER CHANNEL THERMAL MANAGEMENT TECHNIQUES FOR STACKED MEMORY

(71) Applicant: Intel Corporation, Santa Clara, CA (US)

(72) Inventors: Chang Kian Tan, Bayan Lepas (MY); Ru Yin Ng, Bayan Lepas (MY); Saravanan Sethuraman, Bayan Lepas (MY); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 661 days.

(21) Appl. No.: 17/485,343

(22) Filed: Sep. 25, 2021

(65) Prior Publication Data

US 2022/0011960 A1   Jan. 13, 2022

(51) Int. Cl.
G06F 3/06   (2006.01)

(52) U.S. Cl.
CPC ............ *G06F 3/0653* (2013.01); *G06F 3/061* (2013.01); *G06F 3/0676* (2013.01); *G06F 3/0677* (2013.01); *G06F 3/0679* (2013.01)

(58) Field of Classification Search
None
See application file for complete search history.

(56) References Cited

U.S. PATENT DOCUMENTS

| | | |
|---|---|---|
| 2017/0300263 A1 | 10/2017 | Helmick |
| 2017/0344309 A1 | 11/2017 | Balakrishnan et al. |
| 2019/0018712 A1 | 1/2019 | Foxworth et al. |
| 2019/0018713 A1 | 1/2019 | Foxworth et al. |
| 2019/0310896 A1 | 10/2019 | Foxworth et al. |
| 2020/0105722 A1 | 4/2020 | Sethuraman et al. |
| 2021/0208817 A1* | 7/2021 | Shin ................. G06F 3/0679 |

OTHER PUBLICATIONS

Extended European Search Report for Patent Application No. 22188319.2, Mailed Nov. 30, 2022, 9 pages.

* cited by examiner

*Primary Examiner* — Brian R Peugh
(74) *Attorney, Agent, or Firm* — Akona IP PC

(57) ABSTRACT

Per channel thermal management techniques are described herein. In one example, a memory controller receives channel temperature information for one or more channels of one or more dies in the stack. The memory controller can then throttle commands at a channel-level based on the channel temperature information. In one example, row commands and column commands to a channel are throttled at independent rates based on the channel temperature information. In one example, a row command throttling rate or column command throttling rate is based on a ratio of alternating on-time to off time of throttling signals, or a window of time in which commands are enabled or disabled to a channel. In one example, the row and column command throttling signals can be staggered across channels or pseudo channels.

20 Claims, 12 Drawing Sheets

| WIR [12:8] | WIR [7:0] | Instruction | Description | Register Type | WDR Length |
|---|---|---|---|---|---|
| 1Fh, 0Fh-00h | 15h | CHANNEL TEMPERATURE | Returns an 9-bit binary channel temperature code per SID | R | 36 |

IEEE 1500 Instruction 600

Figure 6A

| HBM Channel Temperature 522 | Lower Temperature 524 | Upper Temperature 526 | Row Throttle Ratio Per Channel 528 | Column Throttle Ratio Per Channel 530 |
|---|---|---|---|---|
| 000 | 0C | 50C | R1 | C1 |
| 001 | 50C | 70C | R2 | C2 |
| 011 | 70C | 85C | R3 | C3 |
| 010 | 85C | 90C | R4 | C4 |
| 110 | 90C | 95C | R5 | C5 |

Throttling Table 620

Figure 6B

PER CHANNEL THERMAL MANAGEMENT TECHNIQUES FOR STACKED MEMORY

FIELD

This disclosure relates to thermal management techniques in stacked memory, and in specific examples, to channel-level thermal management of memory such as High Bandwidth Memory (HBM) in a multi-chip package.

BACKGROUND

A multi-chip package can include on-package memory and a logic die. The logic die can be a System on Chip (SoC), a Field Programmable Gate Array (FPGA), a Central Processing Unit (CPU), a Graphics Processing Unit (GPU), or other logic die. An example of on-package memory is High Bandwidth Memory (HBM) Dynamic Random Access Memory (DRAM) that may be compatible with HBM (HBM, JESD235, originally published by JEDEC (Joint Electronic Device Engineering Council) in October 2013), HBM2 (HBM version 2, JESD235C, originally published by JEDEC in January 2020), or HBM3 (HBM version 3 currently in discussion by JEDEC).

Multi-chip packages with on-package memory may experience power and thermal issues due to the proximity of the on-die memory to the logic die in the same package. For example, as computer performance increases so does the demand for a higher bandwidth and faster memory subsystem such as HBM DRAM. However, HBM DRAM operating at higher speeds consumes more power, which results in an increase in operating junction temperature. The higher operating junction temperature results in slower response time and a shorter DRAM refresh period.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 6A illustrates an example of a channel temperature instruction.

FIG. 6B is an example of a throttling table.

Figure 1:
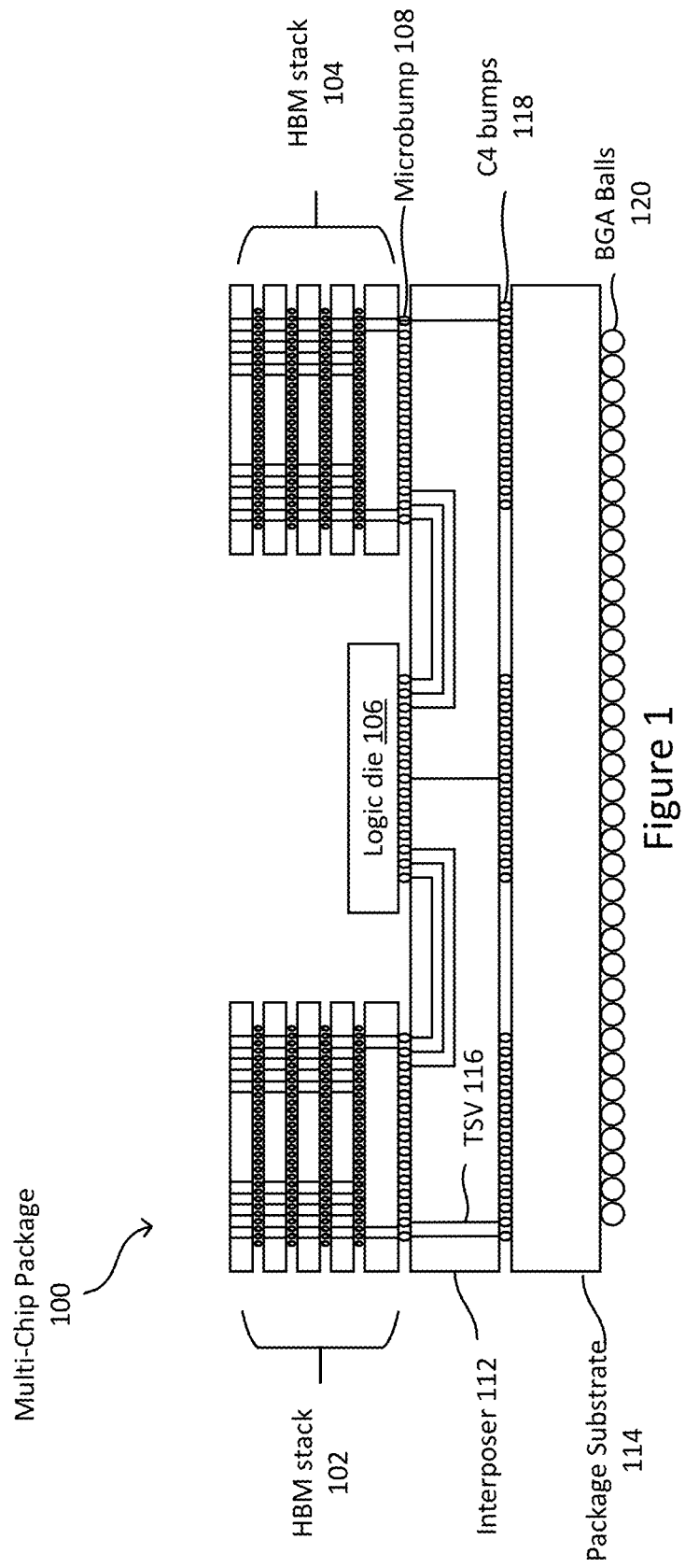
FIG. 1 is a block diagram of an example of a multi-chip package.

Descriptions of certain details and implementations follow, including a description of the figures, which may depict some or all of the embodiments described below, as well as discussing other potential embodiments or implementations of the inventive concepts presented herein.

DETAILED DESCRIPTION

Per channel thermal management techniques for stacked memory are described herein.

To increase memory bandwidth and capacity, more and more DRAM dies are stacked on top of each other in multi-chip packages (e.g., 4 DRAM dies, 8 DRAM dies, 12 DRAM dies, or more than 12 DRAM dies). Each DRAM die can include a plurality of channels. However, DRAMs operating at higher speeds may consume a significant amount of power, resulting in increases in junction temperature of the DRAM dies. Higher operating junction temperature can result in unwanted effects such as the degradation in AC parametric characteristics, slower response time, and shorter refresh time, which can in-turn cause the DRAM operation to become less predictable. Additionally, as the temperature increases, the risk of UE (unrecoverable errors) in memory also increases, which can cause application crashes and system down time, which can be particularly problematic in a server environment. Power and thermal issues are typically worse in the case of in-package memory, such as HBM (High-Bandwidth Memory) due to the proximity of the memory to a core processing unit (e.g., processor) or accelerator (e.g., FPGA or other accelerator) in the same package.

In conventional multi-chip packages, the memory controller can throttle input commands to an entire on-package memory stack when the temperature of a die in the stack exceeds a threshold. This causes data stalls and increases the communication overhead across all of the DRAM dies in the stack resulting in the degradation of overall system performance.

Additionally, there can be significant temperature differences amongst the different dies in the stack. For example, the temperature of the die at the bottom of the stack may be different than the temperature of the die at the top of the stack or in the middle of the stack. Therefore, the approach of throttling input commands to an entire memory stack based on the hottest die in the stack may result in unnecessarily throttling commands to cooler dies in the stack.

In one example, to reduce the performance degradation caused by throttling commands for all the DRAM dies in an on-package memory stack, a per channel thermal management scheme controls the flow of commands to each channel in each of the DRAM dies in the HBM stack.

In one example, a memory controller receives channel temperature information that indicates the temperature of one or more channels of one or more dies in the stack. The memory controller can then throttle commands at a channel-level based on the channel temperature information. In one example, row commands and column commands to a channel are throttled at independent rates based on the channel temperature information. In one example, a row command throttling rate or column command throttling rate is based on a ratio of alternating on-time to off time of throttling signals, or a window of time in which commands are enabled or disabled to a channel. In one example, the row and column command throttling signals can be staggered across channels or pseudo channels. A per channel thermal management approach can improve the thermal distribution in DRAM memory stacks with a large number of DRAM dies with minimal impact to system performance.

FIG. 1 is a block diagram of an example of a multi-chip package 100 in which per channel thermal management techniques may be implemented. In the example illustrated in FIG. 1, the multi-chip package 100 includes a package substrate 114 and an interposer 112 mounted on the package substrate 114. The interposer 112 may be electrically coupled with the package substrate 114 via C4 bumps 118, pads, or any other conductive contacts. The interposer 112 includes metal layers to form conductive traces, through silicon vias (TSVs) 116, and/or other conductive contacts or interconnects. The conductive interconnects in the interposer provide connections amongst devices mounted over the interposer 112 and/or to conductive contacts of the package substrate 114. For example, the interposer 112 may include interconnects to connect the logic die 106 with memory devices, such as the HBM stacks 102, 104. The interposer 112 may include an active device (e.g., a die that includes transistors or other active components) or a passive device (e.g., a die that does not include any active components). In one example, the HBM stacks 102, 104 are connected with the logic die 106 via a bridge die (e.g., an embedded multi-die interconnect bridge (EMIB)), or via another technique to couple chips in a multi-chip package. The ball grid array (BGA) 120 provides conductive contacts to external circuitry such as printed circuit board (PCB).

The multi-chip package of FIG. 1 includes two HBM stacks 102 and 104 coupled with the interposer via microbumps 108. The HBM stacks 102 and 104 each include a stack of memory dies stacked vertically with respect to one another. Each memory die of the HBM stacks 102 and 104 provides memory resources for data storage. Although two HBM stacks 102 and 104 are shown, a single HBM stack or more than HBM stacks may be included in the multi-chip package 100.

The multi-chip package of FIG. 1 includes a logic die 106 mounted on the interposer 112. The logic die 106 can be or include a System on Chip (SoC), a Field Programmable Gate Array (FPGA), Central Processing Unit (CPU), an accelerator, a Graphics Processing Unit (GPU), or other logic die. The logic die 106 is coupled with stacks of memory dies, such as the HBM (high bandwidth memory) stacks 102 and 104 via interconnects in the interposer 112, an EMIB, or other interconnects between the logic die 106 and the HBM stacks 102 and 104.

Figure 2A:
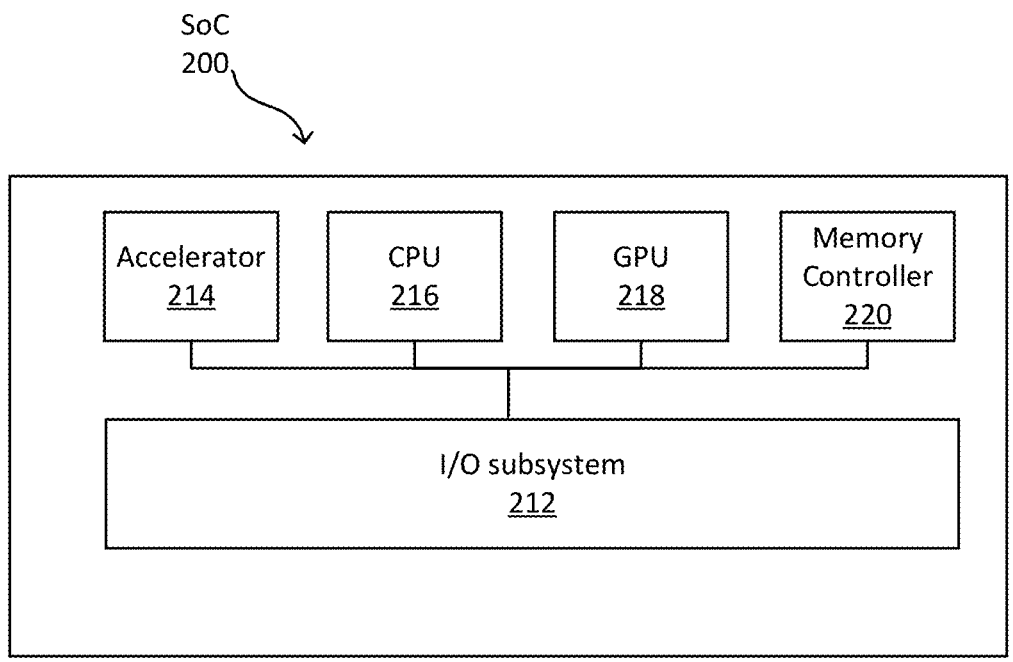
FIG. 2A is a block diagram of an example of a system on a chip (SoC).

FIG. 2A illustrates an example of a system on a chip (SoC) 200. In one example, the logic die 106 of FIG. 1 is or includes an SoC such as the SoC 200 of FIG. 2A. The SoC 200 includes one or more accelerators 214, one or more central processing units (CPUs) 216, one or more graphics processing units (GPUs) 218, and one or more memory controllers 220 in a package.

The SoC of FIG. 2A also includes an I/O subsystem 212. The I/O subsystem 212 may include one or more I/O adapters to translate a host communication protocol utilized within the processor core(s) to a protocol compatible with particular I/O devices. Examples of protocols include Peripheral Component Interconnect (PCI)-Express (PCIe), Universal Serial Bus (USB), Serial Advanced Technology Attachment (SATA) and Institute of Electrical and Electronics Engineers (IEEE) 1594 "Firewire".

In one example, the I/O subsystem 212 can communicate with external I/O devices which can include, for example, user interface device(s) including a display and/or a touchscreen display, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device.

The CPU 216 can correspond to a single core or a multi-core general purpose processor. In one example, the CPU can include multiple cores, where each core includes one or more instruction and data caches, execution units, prefetch buffers, instruction queues, branch address calculation units, instruction decoders, floating point units, retirement units. The GPU 218 can include one or more GPU core. In one example, GPU cores may include one or more execution units and one or more instruction and data caches. The accelerators 214 can include one or more of an artificial intelligence (AI) accelerator, or other hardware accelerator device.

The SoC 200 also includes one or more memory controllers 220. The memory controller 220 is communicatively coupled with memory and other components of the SoC 200 such as the CPU 216, GPU 218, and the accelerator 214. The memory controller includes circuitry for accessing and controlling memory devices, such as memory dies in the HBM stacks 102 and 104 of FIG. 1. The memory controller 220 includes thermal management circuitry to perform channel-level throttling techniques, as described in more detail below.

Figure 2B:
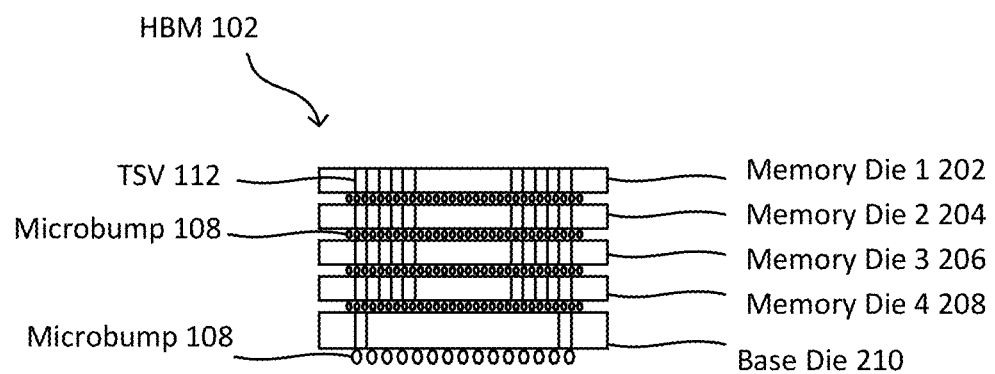
FIG. 2B is a block diagram of an example of a HBM stack.

FIG. 2B illustrates a block diagram of an example of an HBM stack 102. The HBM stack 104 of FIG. 1 may be the same as, or similar to, the HBM stack 102 depicted in FIG. 2. Turning to FIG. 2B, the HBM stack 102 includes four vertically stacked memory dies 202, 204, 206, and 208. The memory dies are coupled to one another via microbumps or other conductive contacts. The memory dies 202, 204, 206, and 208 are stacked over a base die 210. The base die may include interconnects such as through silicon vias (TSVs) and circuitry (e.g., physical layer interface (PHY) circuitry) for coupling with a logic die via an interposer, EMIB, or other interconnecting structure. In the illustrated example, each of the memory dies 202, 204, 206, and 208 includes a memory or storage array for storing data and interconnects for coupling through the stack to the base die 210. In other examples, the HBM stack may not include a base die 210. Although FIG. 1 and FIG. 2B refer specifically to HBM memory stacks, the techniques described herein may apply to any stacked memory technology.

In the illustrated example, each of the memory dies 202, 204, 206, and 208 includes a memory or storage array for storing data and interconnects for coupling through the stack to the base die 210. For example, each die in the stack may communicate with one another and/or with the base die via communication paths such as through silicon vias (TSVs) or other conductive interconnects. In one example, each of the HBM dies is compatible with a JEDEC (Joint Electronic Device Engineering Council) HBM (High Bandwidth Memory) standard, such as HBM (HBM, JESD235, originally published by JEDEC in October 2013), HBM2 (HBM version 2, JESD235C, originally published by JEDEC in January 2020), HBM3 (HBM version 3 currently in discussion by JEDEC), or other HBM standards. For ease of reference, examples may refer generally to "HBM memory," "an HBM stack," or an "HBM die," however, it will be understood that such references may refer to any version of HBM (e.g., HBM, HBM2, HBM3, or other versions of HBM) or similar stacked memory standard or technology.

Figure 3A:
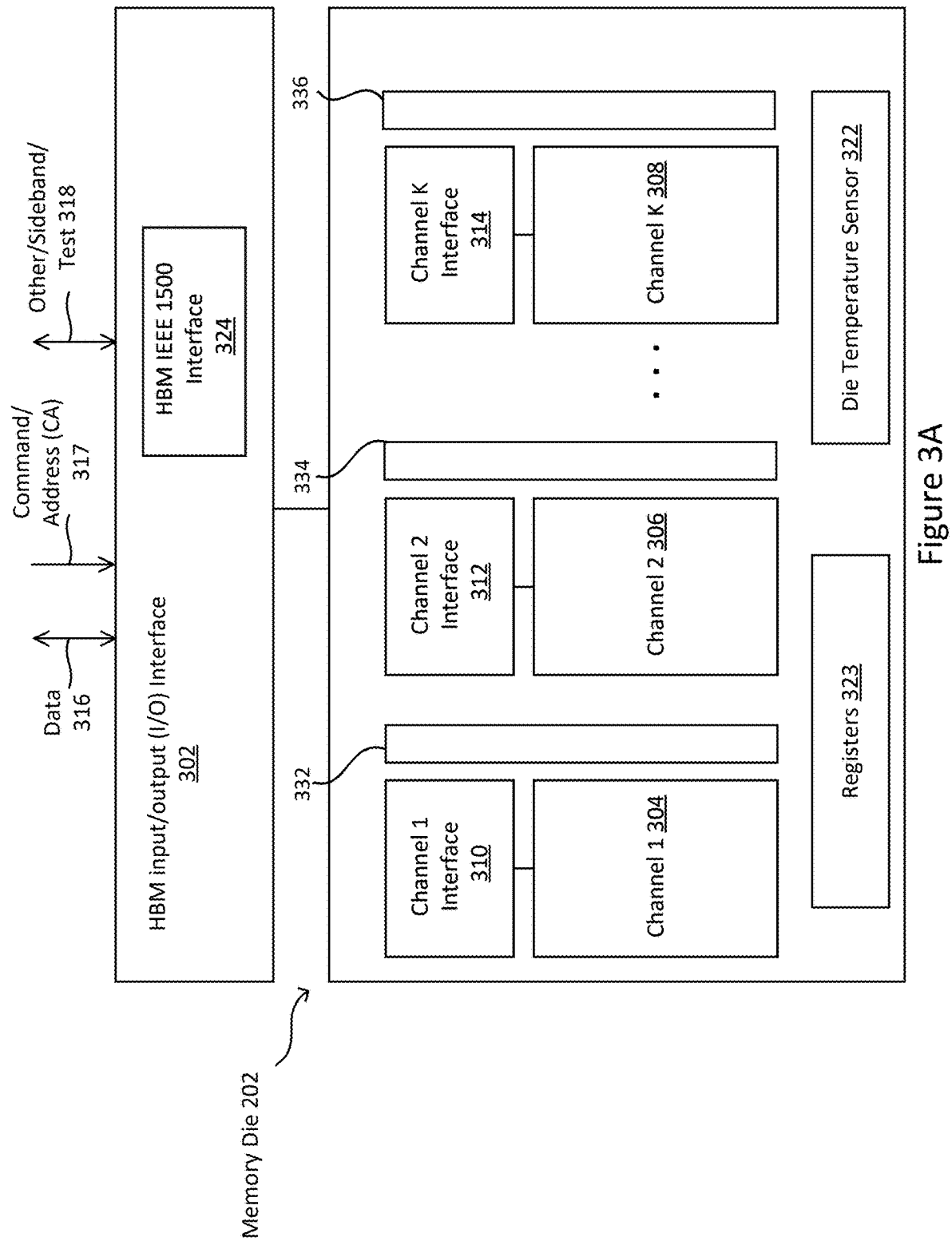
FIG. 3A is a block diagram of an example of a memory die and an HBM interface.

FIG. 3A is a block diagram of an example of the memory die 202 of FIG. 2B. The memory dies 204, 206, and 208 of FIG. 2B may be the same as, or similar to, the memory die 202 illustrated in FIG. 3A.

The memory resources of each memory die can be organized in channels. For example, referring to FIG. 3A, the memory die 202 includes K channels (e.g., channels 1-K). FIG. 3A explicitly illustrates channel 1 304, channel 2 306, and channel K 308 (channels 3 to K−1 are not depicted). In one example, the channels are completely independent and asynchronous of one another. As defined in HBM specifications (e.g., HBM JESD235), each channel includes an independent command and data interface that provides access to a discrete pool of memory resources; each channel interface provides an independent interface to one or more banks of DRAM. Thus, each channel includes channel interface circuitry to enable the transmission of commands and data to and from each channel of the memory die 202. As illustrated in FIG. 3A, the memory die 202 includes channel interface circuitry 310, 312, and 314 for channels 1, 2, and K, respectively.

Figure 3B:
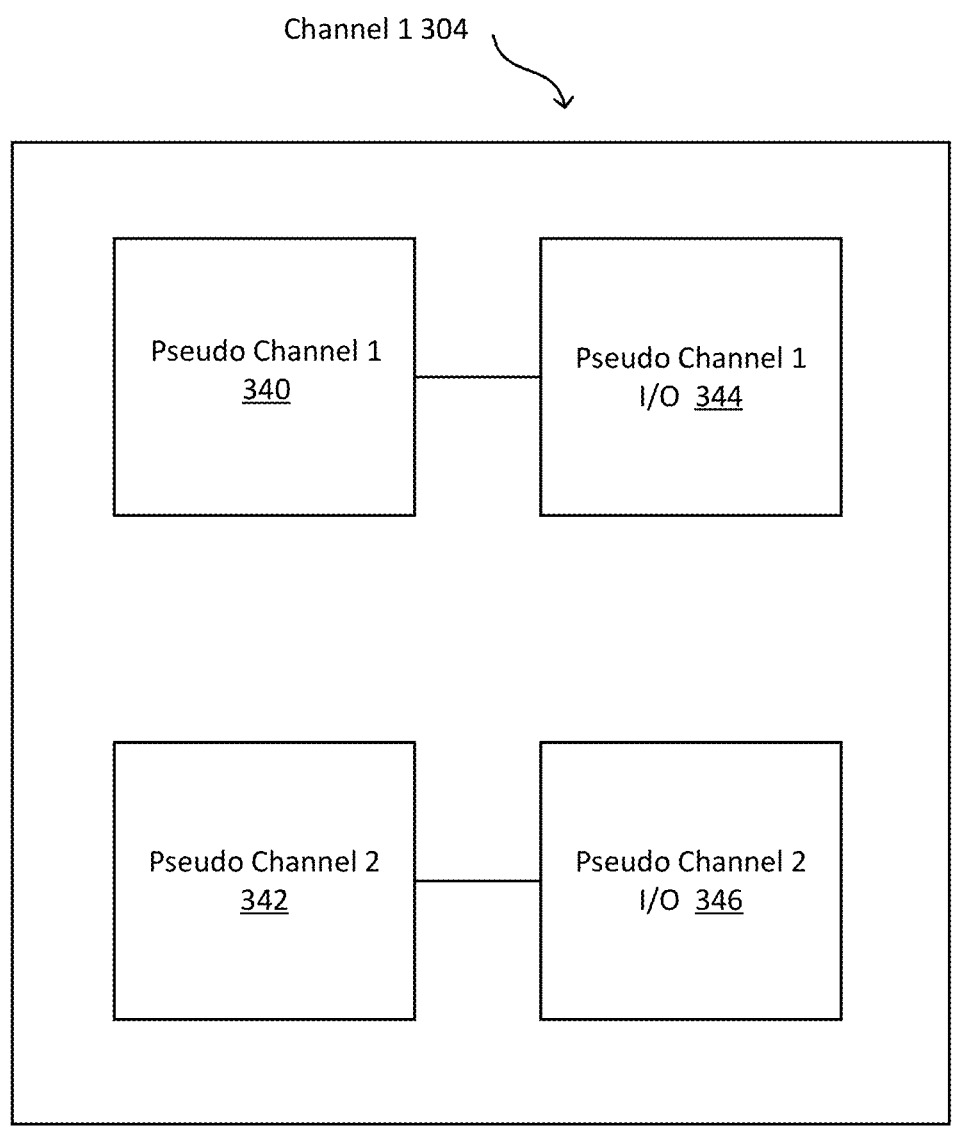
FIG. 3B is a block diagram of an example of a channel including pseudo channels.

Channels can be further divided into sub-channels referred to as pseudo channels. FIG. 3B is a block diagram of an example of a channel including pseudo channels. The example in FIG. 3B depicts channel 1 304 of FIG. 3A, however, the other channels 2-K may be the same as, or similar to, the channel 1 304 of FIG. 3B.

FIG. 3B illustrates an example in which channel 1 304 includes two pseudo channels (PC). As defined in HBM specifications (e.g., HBM JESD235), a pseudo channel divides a channel into two individual sub-channels. The two pseudo channels operate semi-independently. The two pseudo channels share the channel's row and column command bus, but they decode and execute commands individually. In one example, the channel circuitry may include separate pseudo channel control and I/O circuitry for each pseudo channel. For example, FIG. 3B depicts an example in which the channel 1 circuitry 304 includes pseudo channel 1 control circuitry 340 and I/O circuitry 344, and pseudo channel 2 control circuitry 342 and I/O circuitry 346.

Referring again to FIG. 3A, each memory die in a stack includes one or more temperature sensors. For example, the memory die 202 includes a die temperature sensor 322 and a channel temperature sensor for each channel. For example, a channel 1 temperature sensor 332 is to measure the temperature of channel 1 304, the channel 2 temperature sensor 334 is to measure the temperature of channel 2 306, and the channel K temperature sensor 336 is to measure the temperature of channel K 308.

The memory die 202 also includes registers 323, which may include configuration or mode registers. In addition to enabling configuration of the memory die, some of the registers 323 indicate operating conditions of the memory die, which can be read by the memory controller. For example, the registers 323 may include one or more registers to indicate a die temperature and channel temperatures. Temperature information stored in registers may indicate an actual temperature, a temperature range, or other value indicative of temperature. Although the registers 323 are depicted as being included on the memory die, in other examples, registers may also, or alternatively, be included in a base die or other location other than the memory dies.

In the example illustrated in FIG. 3A, the channel interfaces 310, 312, and 314 couple with an HBM input/output (I/O) interface 302, which couples with a memory controller (e.g., the memory controller 220 of FIG. 2A). In one example, the HBM I/O interface is included in a base die of an HBM stack (e.g., the base die 210 if FIG. 2B). The HBM I/O interface 302 includes circuitry for receiving and transmitting data 316, command and address (C/A) information 317, and other signals such as sideband and testing signals 318 via an interface compatible with the IEEE 1500 standard.

In one example, the HBM I/O interface includes an IEEE 1500 interface 324. In one example, the IEEE 1500 interface 324 is a test interface for transmission of testing-related signals, in addition to other signals. In one example, the IEEE 1500 interface enables transmission of test related signals and other signals, including sideband signals, RESET signals, Temperature Report (TEMP[1:0]) signals, and DRAM Catastrophic Temperature Report (CATTRIP) signals. The IEEE-1500 sideband signals include wrapper serial port data out (WSO[a:p]), wrapper serial port clock (WRCK), wrapper serial port reset (WRST_n), wrapper serial port instruction register select (SelectWIR), wrapper serial port shift (ShiftWR), wrapper serial port capture (CaptureWR), and wrapper serial port update (UpdateWR) signals. In one example, the channel temperature information is transmitted from the dies to the memory controller via the IEEE 1500 interface 324.

In one such example, the channel temperature information can be read by the memory controller with a "channel temperature" command or instruction. For example, FIG. 6A illustrates an example of a channel temperature test instruction 600. In one such example, the channel temperature command is a "test instruction" that is transmitted over a test interface (e.g., the IEEE 1500 interface 324). In one such example, the channel temperature information is received by the memory controller via the same test interface (e.g., the IEEE 1500 interface 324).

In one example, the channel temperature instruction includes a value for the "wrapper instruction register" encoding (e.g., WIR[12:8] and [7:0]) to indicate that the instruction is a channel temperature instruction. In one example, the channel temperature instruction causes the contents of a channel temperature register to be read and returned. In the example of FIG. 6A, the register is a read-only register including 36 bits of channel temperature data. For example, the channel temperature register may indicate channel temperatures for each SID, where SID refers to "stack ID" and identifies a stack of dies. In one example, the instruction returns a 9-bit binary channel temperature code per SID.

In other examples, the channel temperature information can be transmitted to the memory controller via other signal lines.

Regardless of which signal lines the temperature information is transmitted over, the memory controller reads channel temperature information to enable per channel thermal management.

FIGS. 4A-4E illustrate examples of circuitry for performing per channel thermal management. As mentioned above, per channel thermal management can enable throttling row commands and column commands independently at a channel-level. An example of a row command is an ACTIVATE (ACT) command. An example of a column command is a READ or WRITE command. In order to read or write to HBM DRAM, an ACTIVATE command is first sent to select a bank and row address to be activated, which transfers that row's cell data stored in the memory array to sense amplifiers. Once a row is opened, a READ will decode a specific column along the row that will be transferred to the sense amplifiers to drive the data out from the column. A WRITE command typically stores the data to the row buffer through the I/O gating logic and the data is then written to the memory array.

Energy consumption is typically different for row commands (e.g., ACTIVATE) and column commands (e.g., READ and WRITE). For example, an ACTIVATE command can consume more energy than READ or WRITE commands. Thus, the techniques described herein that throttle row commands and column commands to a channel at a rate independently can lower operating temperatures and avoid hotspots without significantly reducing system performance.

Figure 4A:
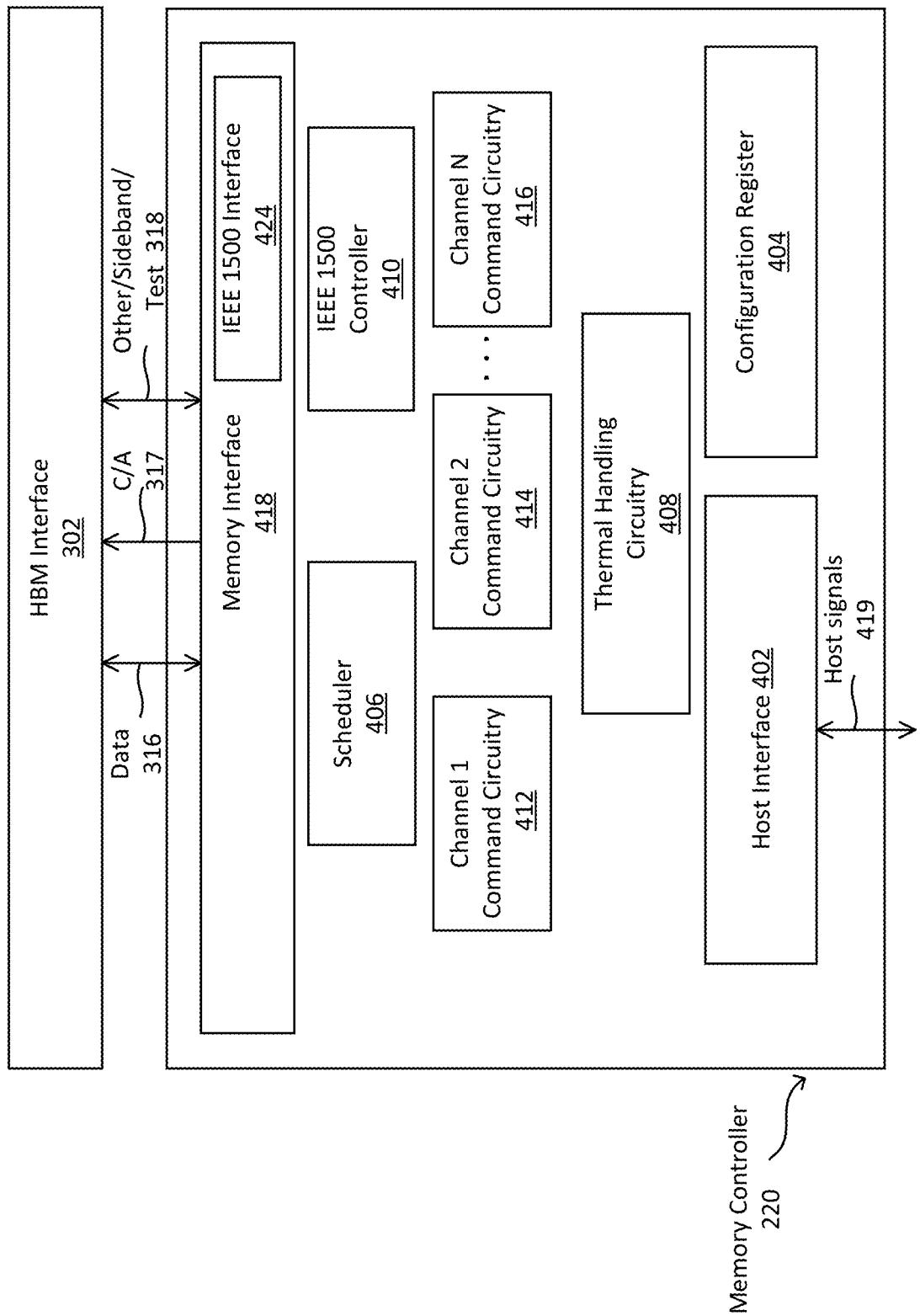
FIG. 4A is a block diagram of an example of a memory controller including per channel thermal management circuitry.

FIG. 4A is a block diagram of an example of a memory controller 220 including per channel thermal management circuitry. In the example illustrated in FIG. 4A, the memory controller 220 is coupled with a host (e.g., a CPU, GPU, an accelerator, or other processing device of the multi-chip package) via a host interface 402. The memory controller 220 communicates with the host via the host interface 402 through the receipt and transmission of host signals 419 via one or more buses. In one example, the host interface 402 includes an Advanced eXtensible Interface (AXI) interface or other high speed multi-host/multi-device communication interface. In another example, the host interface 402 can include high speed serial differential interfaces such as compute express link (CXL™), OpenCAPI™, or ARM® CHI interfaces. Thus, the memory controller 220 receives memory access requests (e.g., read or write requests) from a processing device via the host interface 402.

The memory controller includes circuitry for handling memory access requests received from a processing device and transmitting appropriate commands to memory to satisfy the memory access requests. For example, the memory controller of FIG. 4A includes channel command circuitry for each of the independent memory channels 1-N. FIG. 4A explicitly illustrates channel command circuitry for channels 1, 2, and N (e.g., channel 1 command circuitry 412, channel 2 command circuitry 414, and channel N command circuitry 416; command channel circuitry for channels 3 to N-1 are not depicted).

Figure 4B:
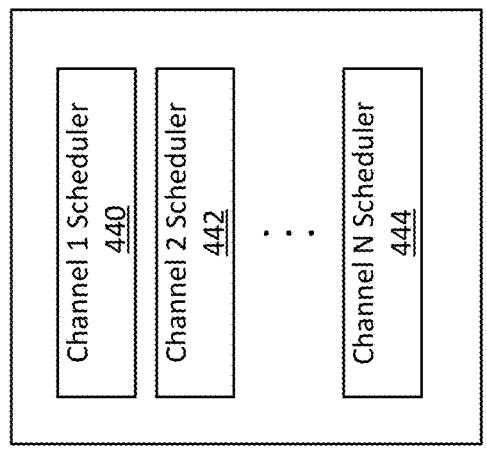
FIG. 4B is a block diagram of an example of a scheduler.

Channel command circuitry 412, 414, and 416 includes circuitry for generating commands for the associated channel. The generated commands are then scheduled (e.g., via scheduler 406) for transmission to the target channels of memory. In one example, the scheduler 406 includes circuitry for scheduling commands to each channel. For example, FIG. 4B illustrates an example of a memory controller with a scheduler for each channel (e.g., Channel 1 scheduler 440, channel 2 scheduler 442, and channel N scheduler 444, where there are N independent memory channels). In another example, a memory controller may include a scheduler for each pseudo channel. Although the scheduler 406 is depicted as a separate block, scheduling circuitry may be included in the channel command circuitry.

Referring again to FIG. 4A, the scheduled commands are transmitted to memory via the memory interface 418. The memory interface 418 includes I/O interface circuitry coupled with a memory-side interface, such as the HBM interface 302. In the example illustrated in FIG. 4A, the I/O circuitry of the memory interface 418 transmits and receives signals such as such as command/control and address signals 317, data signals 316, and/or other signals 318 (e.g., test, sideband, or other signals). The HBM interface may include, for example, I/O interface circuitry compatible with an HBM standard. In one example, the HBM interface is located on a base die of an HBM stack, such as the base die 210 of FIG. 2B.

In one example, the memory controller includes circuitry for the control, receipt, and transmission of information over IEEE 1500 signal lines (e.g., sideband and test signal lines 318). For example, the memory controller 220 of FIG. 4A includes an IEEE 1500 compatible interface 424 and IEEE 1500 control circuitry 410. In one such example, the IEEE 1500 compatible interface 424 is coupled with a memory-side IEEE 1500 compatible interface, such as the interface 324 of FIG. 3A. In one such example, the memory controller receives channel temperature information from a memory die via the IEEE 1500 compatible interface 424. In one such example, the memory controller sends a command such as "channel temperature" command to a memory die to retrieve register contents indicating channel temperature information. In other examples, the channel temperature information may be received by the memory controller in response to other commands.

Figure 4C:
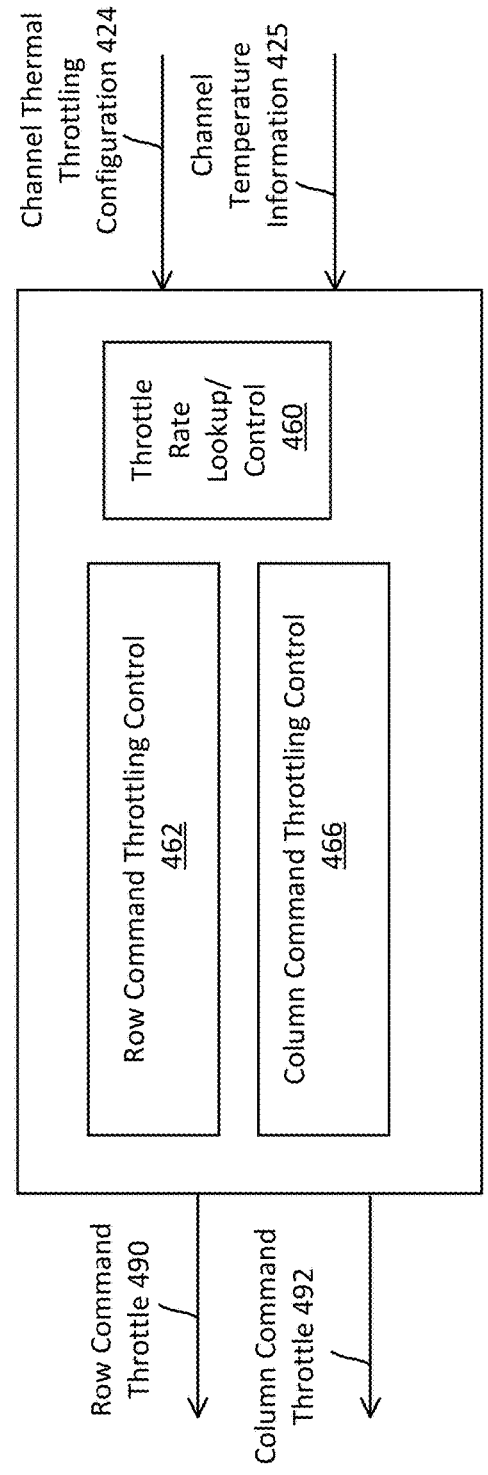
FIG. 4C illustrates a block diagram of thermal handling circuitry 408.

The memory controller 220 also includes thermal handling circuitry 408 to perform per channel thermal management. FIG. 4C illustrates a block diagram of thermal handling circuitry 408. In the example illustrated in FIG. 4C, the thermal handling circuitry 408 independently throttles row commands and column commands to a channel based on channel temperature information. For example, the circuitry throttles row commands to a channel at a first rate based on the channel temperature information, and throttles column commands to the channel at a second rate based on the channel temperature information. As mentioned above, row and column commands in HBM have different power consumption rates. When the temperature exceeds a predefine range, the thermal handling circuitry can handle the row or/and column commands based on rate provided by user to reduce the temperature by lowering the power consumption. Thus, limiting the row and column commands to a channel when channel temperature increases can result in power dissipated on the DRAM channel.

As mentioned above, channel temperature information indicates the temperature of one or more channels of a die and is received from one or more stacked memory dies. In one example, the channel temperature information received from the dies may be stored in a register or other storage on the memory controller.

The thermal handling circuitry 408 receives the channel temperature information 425 and determines a row throttling rate and a column throttling rate for the channel based on that channel's temperature information. In one example, the circuitry 460 may compute a rate based on whether the channel temperature information indicates that the temperature is above or below one or more thresholds. In another example, the circuitry 460 may look up the rate in a look up table to determine a rate based on the channel temperature information.

For example, FIG. 6B illustrates an example of a throttling table 620. In one example, the throttling table is stored in one or more registers, or in other storage in the memory controller. In the example illustrated in FIG. 6B, the throttling table includes an HBM channel temperature 522. In one example, the HBM channel temperature 522 is an encoded value indicating a range of temperatures including a lower temperature 524 and an upper temperature 526. For example, the HBM channel temperature '000b' corresponds to a range of 0° C.-50° C., the HBM channel temperature '001b' corresponds to a range of 50° C.-70° C., the HBM channel temperature '011b' corresponds to a range of 70° C.-85° C., the HBM channel temperature '010b' corresponds to a range of 85° C.-90° C., and the HBM channel temperature '110b' corresponds to a range of 90° C.-95° C. In other examples, the HBM channel temperature may indicated by an actual temperature value, different or additional ranges than the ranges depicted in FIG. 6B, or other information indicative of channel temperature.

The table 620 also includes a row throttle ratio 528 and a column throttle ratio 530 corresponding to each HBM channel temperature range 522. In one example, the column throttling ratio is the ratio of alternating on-time to off-time of a column command throttling signal. Similarly, the row throttling ratio is the ratio of alternating on-time to off-time of a row command throttling signal. In one such example, the 'on-time' indicates the number of clocks in which commands are disabled, and the 'off-time' indicates the number of clocks in which commands are enabled. The ratios for each channel are independent of one another and may be the same or different. Also, the ratio for column commands may be the same or different than the ratio for row commands for a given channel.

Consider the example where the HBM channel temperature in the range of 0-50° C. In this example, the HBM channel temperature corresponds to the HBM channel temperature range given by '000b', which corresponds to the row command throttling ratio of R1 and a column throttling ratio C1, where R1 may be the same as or different than C1. Although parameters for a single channel are shown in table 620, the table 620 may include a separate mapping of throttling ratios to channel temperature for each channel. Thus, thermal handling circuitry can look up throttling rate information (e.g., the row throttle ratio 528 and the column throttle ratio 530) based on the channel temperature information and generate row command throttling and column command throttling signals based on the rate information.

In one example, the row and column command throttling rates can be configured by a user. For example, the memory controller 220 may provide an option for the user to specify the HBM device junction temperature at which the controller begins to throttle row/column commands, and the thermal handler ratio that determines the throttle frequency per HBM channel. For example, referring to the table 620, the row throttle ratio 528 and column ratio 530 can be modified by a user (e.g., by a BIOS hardware configuration routine, an operating system (OS), a processing unit such as CPU, GPU, or FPGA, or other processing device, a system administrator, or other source of hardware configuration). In one such example, referring to FIG. 4A, the memory controller receives channel throttling configuration information via the host interface 402 and stores the configuration information in the configuration register 404. Thus, the column throttling ratio and row throttling ratio per channel may be configurable, which can enable fine tuning of the thermal management based on expected workloads and performance requirements.

Although the table 620 illustrates on/off time ratios corresponding to HBM channel temperature ranges, in another example, the throttling rate may be based on a window of time in which row commands or column commands are enabled or disabled. The thermal handling circuitry can disable only row commands for a window of time, only column commands for a window of time, or both row and column commands for a window of time. For example, rather than an on/off ratio that indicates alternating on-time to off-time for the throttling signals, a throttling window can specify a window of time in which row commands to a channel are to be enabled or disabled, and a window of time in which column commands to a channel are to be enabled or disabled. In one example, the duration of the window of time is configurable (e.g., by modifying a register, such as the configuration register 404 of FIG. 4A). Regardless of which specific throttling technique is used (e.g., on/off ratio, window-based technique, or other throttling technique), in one example, the row command throttling rate for a channel is independent from the column command throttling rate.

Thus, referring again to FIG. 4C, the thermal handling circuitry 408 includes circuitry 460 to look up or determine a throttling rate for row commands and column commands for each channel based on received channel temperature information 425. Based on the row and column command throttling rates, a row command throttling signal 490 is generated (e.g., by row command throttling control circuitry 462) and a column command throttling signal 492 is generated (e.g., by column command throttling circuitry 466). The row and command throttling signals can then be used to throttle row and column commands to a channel.

Figure 4D:
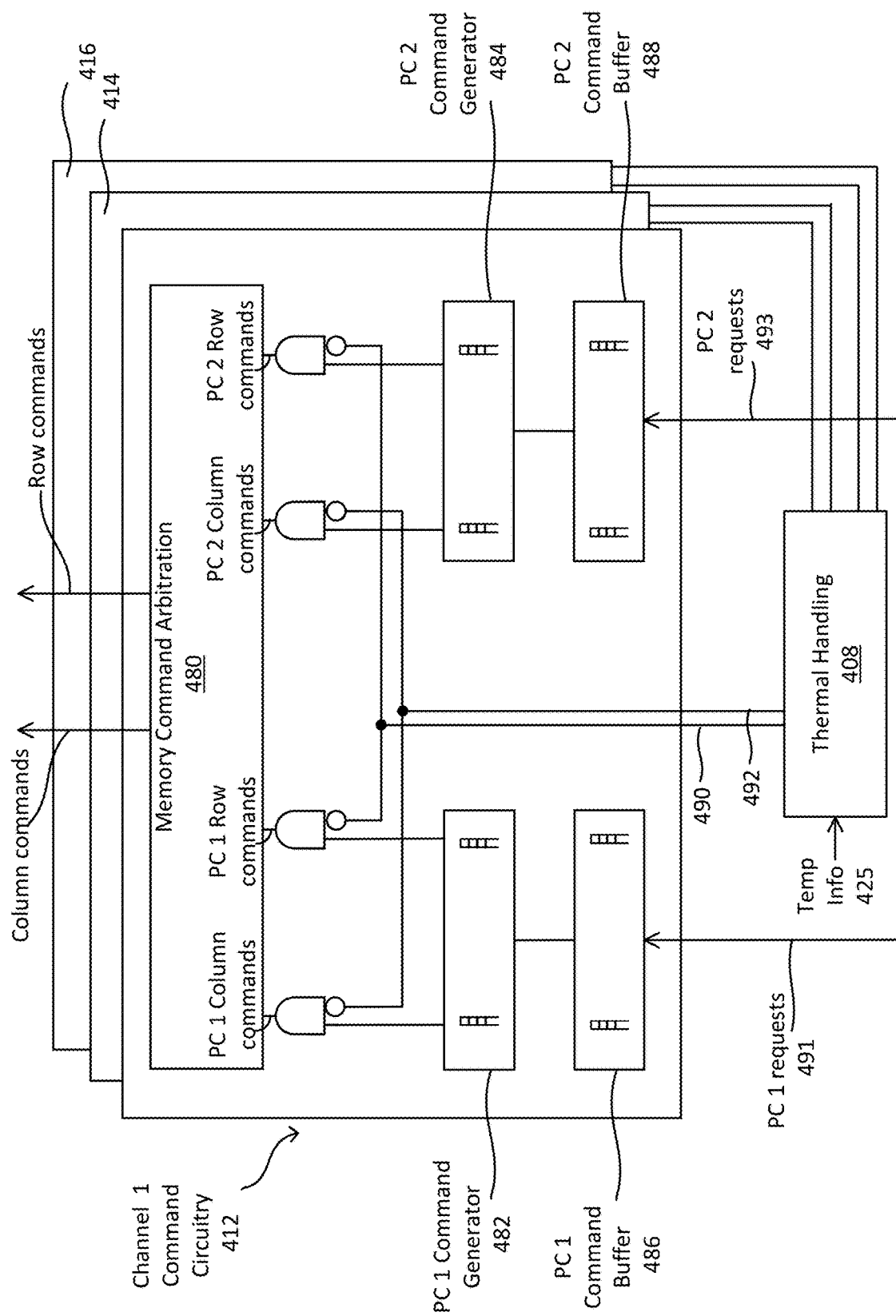
FIG. 4D is a block diagram of an example of a channel command circuitry.

FIG. 4D is a block diagram of an example of a channel command circuitry 412. FIG. 4D illustrates an example of how the row and command throttling signals can be used to throttle row and column commands to a channel. The channel command circuitry 412 depicted in FIG. 4D is for channel 1; however, the memory controller may include separate and independent channel command circuitry for each channel (e.g., channel 2 command circuitry 414 and channel N command circuitry 416).

Each channel's command circuitry receives memory access requests to a channel and generates commands to the channel to satisfy the requests. Memory command arbitration circuitry 480 receives the generated row and column commands from each pseudo channel, and determines an appropriate order in which to send the row and column commands to the channel.

The channel command circuitry in FIG. 4D includes a separate buffer and command generator for each pseudo channel of a channel. For example, memory access requests 491 to pseudo channel 1 (PC1) of channel 1 are received by a command buffer 486. A command generator 482 for pseudo channel 1 of channel 1 then generates row and column commands (PC 1 column commands and PC 1 row commands) to transmit to pseudo channel 1 of channel 1. Similarly, memory access requests 493 to pseudo channel 2 (PC2) of channel 1 are received by a command buffer 488. A command generator 484 for pseudo channel 2 of channel 1 then generates row and column commands (PC 2 column commands and PC 2 row commands) to transmit to pseudo channel 2 of channel 1.

As discussed above with respect to FIG. 4C, the thermal handling circuitry can independently throttle row and column commands for each channel based on channel temperature information 425. For example, the thermal handling circuitry generates a row command throttling signal 490 and a separate column command throttling signal 492. In one example, the row and column command throttling signals 490 and 492 are sent to the channel command circuitry to enable or disable row or column commands to each pseudo channel of the target channel. For example, FIG. 4D depicts an example in which the throttling signals 490 and 492 are inverted and logically "ANDed" with commands generated by the pseudo channel command generators 482 and 484. Thus, in one example, the throttling signal independently enables and disables row and column commands for each pseudo channel of a channel.

Although FIG. 4D only depicts the channel command circuitry of channel 1, in one example, the thermal handling circuitry 408 sends row and column command throttle signals to each channel's command circuitry. The row and column throttling signals for each channel may be the same or different. Although FIG. 4D illustrates the row and column throttle signals being sent to channel command circuitry, in other examples, the throttling signals may be used to throttle the commands at a different point in the command pipeline (e.g., at the scheduler).

Thus, in one example, each channel command generator throttles its ROW command and Column command generations. The generated DRAM commands are then arbitrated between each pseudo channel prior sending to HBM. This technique can enable row and column commands to a channel to be throttled in such a way that the memory power is reduced and temperature is maintained without sacrificing on the performance.

Figure 4E:
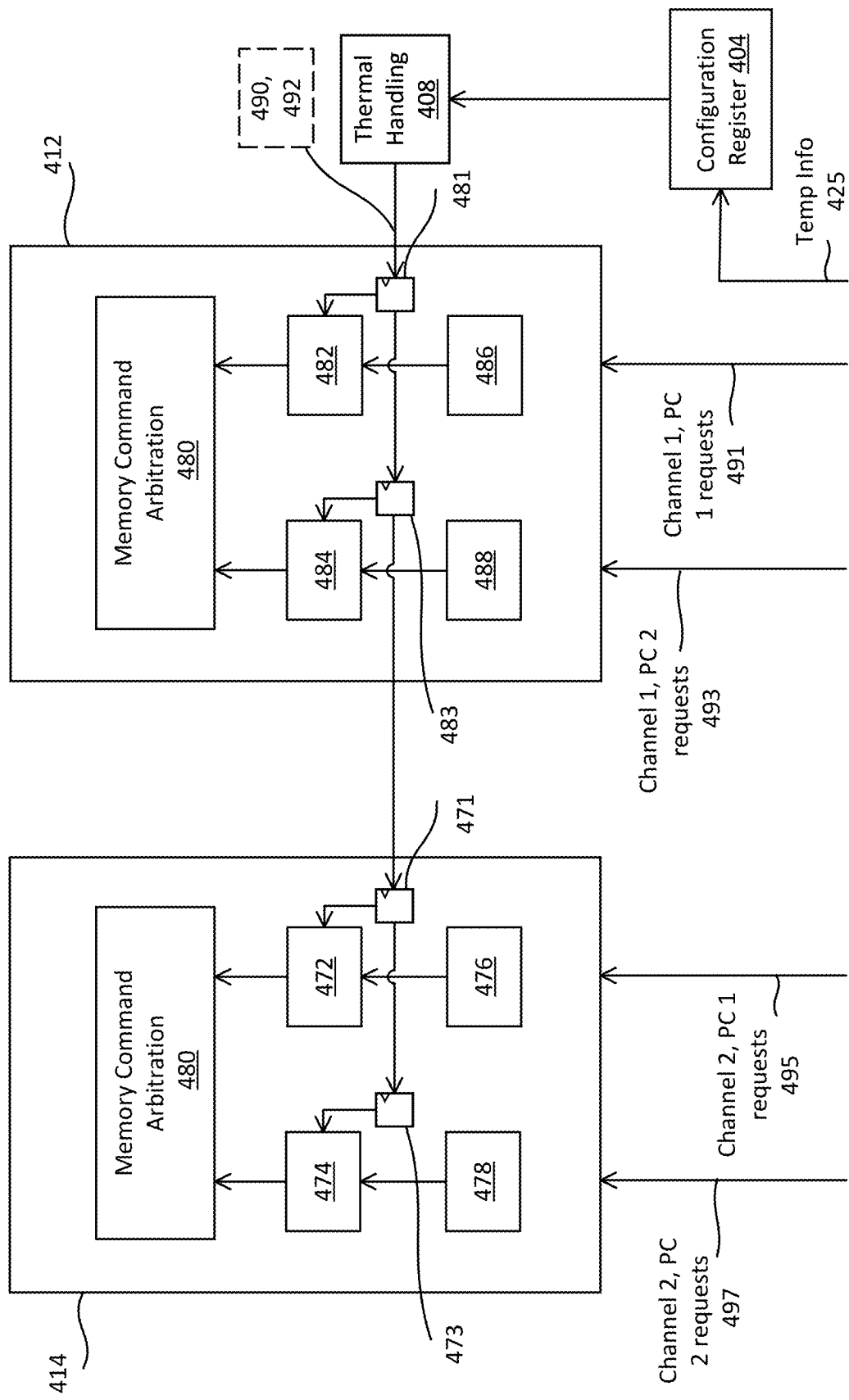
FIG. 4E is a block diagram of an example of circuitry to enable staggering of a throttling signal across channels.

In addition to independently throttling row and column commands per column, staggering the row and column command throttling signals across pseudo channels can enable maintaining system performance while throttling due to elevated temperatures. Staggering row and column commands across pseudo channels can also avoid row hammer issues within the HBM memory subsystem. FIG. 4E is a block diagram of an example of circuitry to enable staggering of a throttling signal across pseudo channels. In the example illustrated in FIG. 4E, a staggering effect in the row and column throttle signals can be achieved by propagating the throttle signals through flip flops in series for each pseudo channel of a channel. Note that FIG. 4E includes channel command circuitry 414 for channel 2 with elements that are similar to the channel command circuitry 412 for channel 1. For example, the channel command circuitry 414 includes command buffers 476 and 478 for pseudo channels 1 and 2, respectively. Memory access requests 495 to pseudo channel 1 (PC1) of channel 2 are received by the command buffer 476. Similarly, memory access requests 497 to pseudo channel 2 (PC2) of channel 2 are received by the command buffer 478. Additionally, the channel command circuitry 414 includes command generators 472 and 474 for pseudo channels 1 and 2, respectively.

For example, the thermal handling circuitry 408 sends row command throttle signal 490 and column command throttle signal 492 to channel command circuitry 412. The row and column throttle signals are received by the flip flop 481. The row and column throttle signals to the pseudo channel 1 of the channel 1 are received by the command generator 482. The row and column throttle signals are then sent to the next flip flop 483. The row and column throttle signals are received by the flip flop 483. The row and column throttle signals to the pseudo channel 2 of the channel 1 are received by the command generator 484. The row and column throttle signals are then sent to the next flip flop 471. The row and column throttle signals are received by the flip flop 471. The row and column throttle signals to the pseudo channel 1 of the channel 2 are received by the command generator 472. The row and column throttle signals are sent to the next flip flop 473. The row and column throttle signals are received by the flip flop 473. The row and column throttle signals to the pseudo channel 2 of the channel 2 are received by the command generator 474. Thus, a staggering effect can be achieved in both the row command throttle signal and the column command throttle signal across pseudo channels of one or more channels. Although a single flip flop at each command generator is shown in FIG. 4E, it will be understood that there may be a separate signal path with separate flip flops at each command generator for the row and column throttle signals.

Although FIG. 4E illustrates a specific example using flip flops at each command generator to stagger the throttling signals across pseudo channels, other circuitry to stagger the row and column throttling signals for each channel may be used. For example, circuitries such as a shift register, a buffer, or multiple flip flops can be used to stagger the signals at each stage for more than one clock cycle.

In one example, the thermal handling circuitry 408 generates a row throttle signal to a pseudo channel that is staggered relative to the row throttle signal to another pseudo channel. Two signals are relatively staggered when the signals' first on-time are not aligned. Similarly, the thermal handling circuitry 408 can generate column throttle signal to a pseudo channel that is staggered relative to the column throttle signal to another pseudo channel.

In another example, the thermal handling circuitry 408 can generate a row throttle signal to a pseudo channel that is aligned (e.g., not staggered) relative to the row throttle signal to another pseudo channel. Similarly, the thermal handling circuitry 408 can generate column throttle signal to a pseudo channel that is aligned relative to the column throttle signal to another pseudo channel.

Thus, the thermal handling circuitry 408 can generate row and column throttle signals to a pseudo channel that are aligned or staggered relative to one another.

Figure 5:
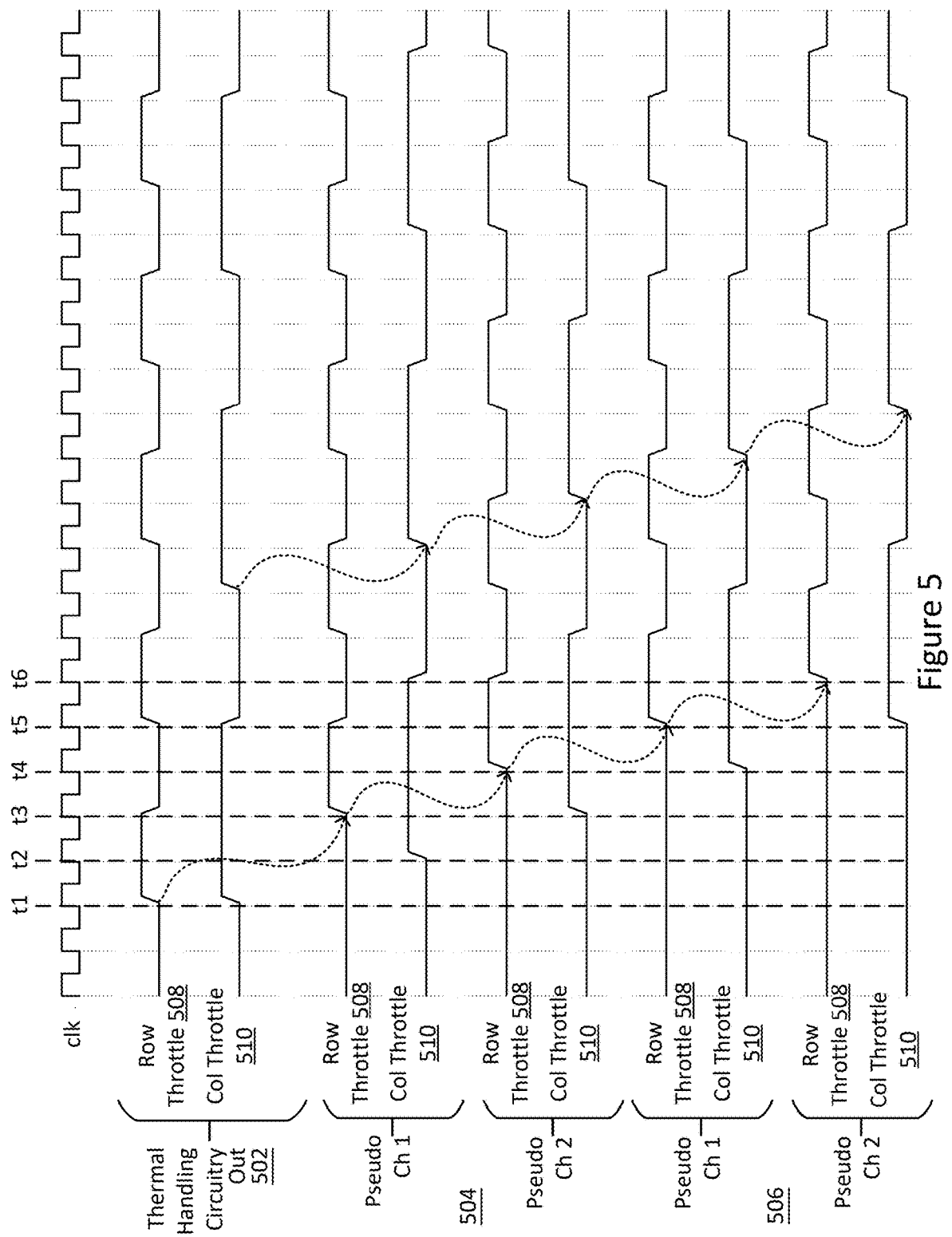
FIG. 5 is a timing diagram illustrating an example of row and column throttle signals staggered across pseudo channels.

FIG. 5 is a timing diagram illustrating an example of row and column throttle signals staggered across pseudo channels.

The timing diagram of FIG. 5 illustrates an example of output signals 502 from thermal handling circuitry, including a row command throttling signal 508 and a column command throttling signal 510. The row command throttling signal 508 is an example of the row command throttling signal 490 of FIG. 4C. The column command throttling signal 510 is an example of the column command throttling signal 492 of FIG. 4C. The timing diagram in FIG. 5 also shows the throttling signals 508 and 510 at channel 1 504 and channel 2 506. In one example, the row throttle signal 508 and the column throttle signal 510 is a periodic signal with an on period (e.g., in which the signal is asserted) followed by an off period (e.g., in which the signal is de-asserted), followed by an on period, and so forth. In one example, the on-period or off-period is in a range of 2-4 clock cycles. Other on period and off periods are possible (e.g., one clock cycle, or more than four clock cycles (e.g., 8, 10, 16, etc.). The ratio of the alternating on time to off time can be defined as the ratio for one cycle of on-time to off-time, or over multiple cycles of on-time to off-time.

FIG. 5 illustrates an example in which the row and column command throttling rates are different. For example, the row throttle rate is based on a ratio of 50:50 (e.g., 1:1) of alternating on-time to off-time. For example, between time t1 and time t3, the row throttle signal 508 is on (or asserted) and between the time t3 and time t5, the row throttle signal 508 is off (or de-asserted). Therefore, in the illustrated example, the row command throttling signal 508 is on for two clock cycles, and then off for two clock cycles, and so forth. In one such example, this results in row commands to a channel being throttled or disabled for two cycles and then enabled for two cycles, and so forth. In the example of FIG. 5, the column command throttling rate is based on a ratio of 4:3 on-time to off-time. Therefore, in the illustrated example, the column command throttling signal 510 is on for four clocks, and then off for three clocks, and so forth. In one such example, this results in column commands to a channel being throttled or disabled for four cycles and then enabled for three cycles, and so forth. There are other methods to denote and express row and command throttle rate. In one example the row and command throttle rate can be expressed as a percentage. For example, in FIG. 5 the row throttle signal 508 has 50% on-time and 50% off-time. Similarly, the column throttle signal 510 has 57% on-time and 43% off-time. Other ratios are possible between 0%:100% (e.g., all off time)-100%:0% (e.g., all on time).

As can be seen in FIG. 5, the row command throttle signal 508 and the column command throttle signal 510 is staggered across the pseudo channels. For example, the on-time of the row command throttling signal 508 starts at time t1 at the thermal handling circuitry and is then propagated to pseudo channel 1 of channel 1, pseudo channel 2 of channel 1, to pseudo channel 1 of channel 2, and pseudo channel 2 of channel 2. The propagation delays (e.g., due to flip flops or other staggering or delay circuitry) cause the beginning of the on-time to be staggered. For example, the on-time of the row command throttling signal 508 starts at time t3 at pseudo channel 1 of channel 1, time t4 at pseudo channel 2 of channel 1, time t5 at pseudo channel 1 of channel 2, and time t6 at pseudo channel 2 of channel 2. Similarly, the on-time of the column command throttling signal 510 starts at time t2 at pseudo channel 1 of channel 1, time t3 at pseudo channel 2 of channel 1, time t4 at pseudo channel 1 of channel 2, and time t5 at pseudo channel 2 of channel 2.

Although the examples in FIGS. 4E and 5 illustrate staggering across pseudo channels, in another example, the row and column throttle commands may be staggered across channels. Also as noted above, in other examples, the throttle signals are not staggered across the pseudo channels. In one example, the command staggering across pseudo channels or channels can also be applied for refresh commands. For example, refresh commands to a bank of a channel may be staggered by a number of clocks based on the channel temperature. In one such example, refresh commands may be staggered in such a way that a hot channel pseudo channel is refreshed faster than a cold channel or pseudo channel. Additionally, staggering refresh commands can result in refresh timings being reduced significantly as tRFC takes into account on the noise from all channels refreshing at the same time. Staggering of refresh commands can be implemented in a similar way as staggering of the row and column throttling signals, discussed above.

Figure 7:
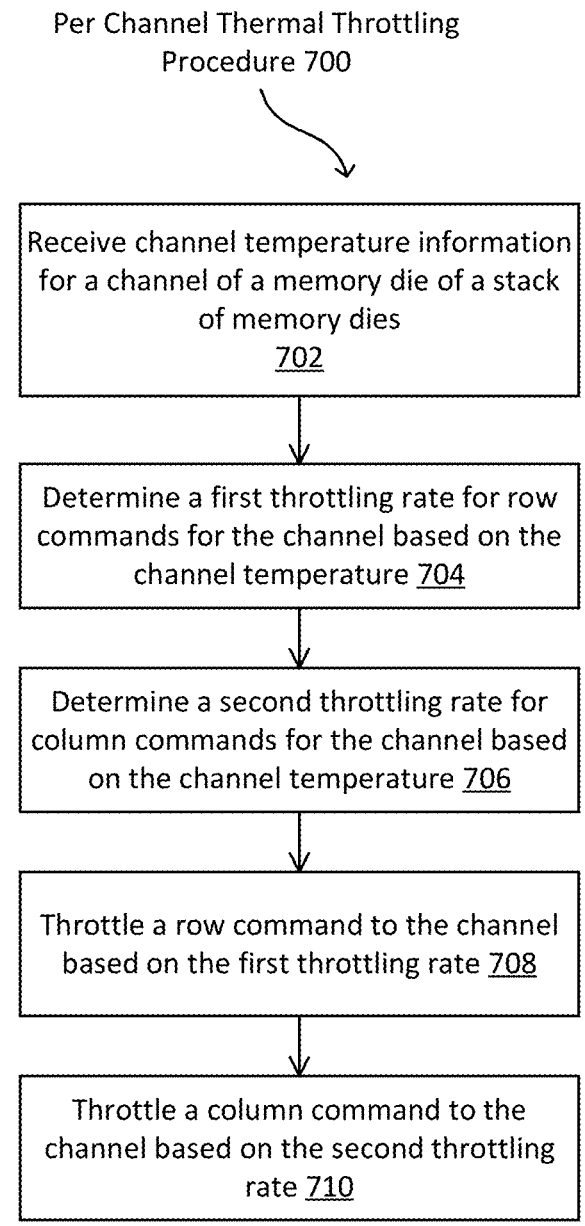
FIG. 7 is an example of a flow diagram illustrating an example of a method to perform per channel thermal throttling.

FIG. 7 is an example of a flow diagram illustrating an example of a method to perform per channel thermal throttling. In one example, the method 700 may be performed by circuitry of a memory controller, such as thermal handling circuitry 408 of FIG. 4A.

Referring to FIG. 7, the method 700 begins with receiving channel temperature information for a channel of a memory die of a stack of memory dies, at block 702. For example, referring to FIG. 4A, I/O circuitry of the host interface 402 may receive channel temperature information that indicates the temperature of one or more channels.

After receiving channel temperature information, the method involves determining a first throttling rate for row commands for the channel, at block 704. For example, referring to FIG. 4B, the thermal handling circuitry 408 may determine the first rate based on a ratio of alternating on-time to off-time of a row command throttling signal to the channel. In one such example, the on-time of the row command throttling signal indicates a number of clock cycles in which row commands are disabled (e.g., throttled), and the off-time of the row command throttling signal indicates a number of clock cycles in which row commands are enabled (e.g., not throttled). In another example, the first rate is based on a window of time in which the row commands to the channel are disabled or enabled.

Referring again to FIG. 7, the method also involves determining a second throttling rate for column commands to the channel based on the channel temperature, at block 706. For example, referring to FIG. 4B, the thermal handling circuitry 408 may determine the second rate based on a ratio of alternating on-time to off-time of a column command throttling signal to the channel. In one such example, the on-time of the column command throttling signal indicates a number of clock cycles in which column commands are disabled (e.g., throttled), and the off-time of the column command throttling signal indicates a number of clock cycles in which column commands are enabled (e.g., not throttled). In another example, the second rate is based on a window of time in which the column commands to the channel are disabled or enabled.

After determining the rate at which to throttle column and row commands, the method involves throttling a column command to the channel based on the first throttling rate, at block 708, and throttling a row command to the channel based on the second throttling rate, at block 710.

Thus, the per channel throttling techniques described herein can enable a reduction in power without sacrificing the overall performance of the system. Although some examples specifically refer to HBM, the techniques described herein may apply to other stacked dies with different memory types as well.

Figure 8:
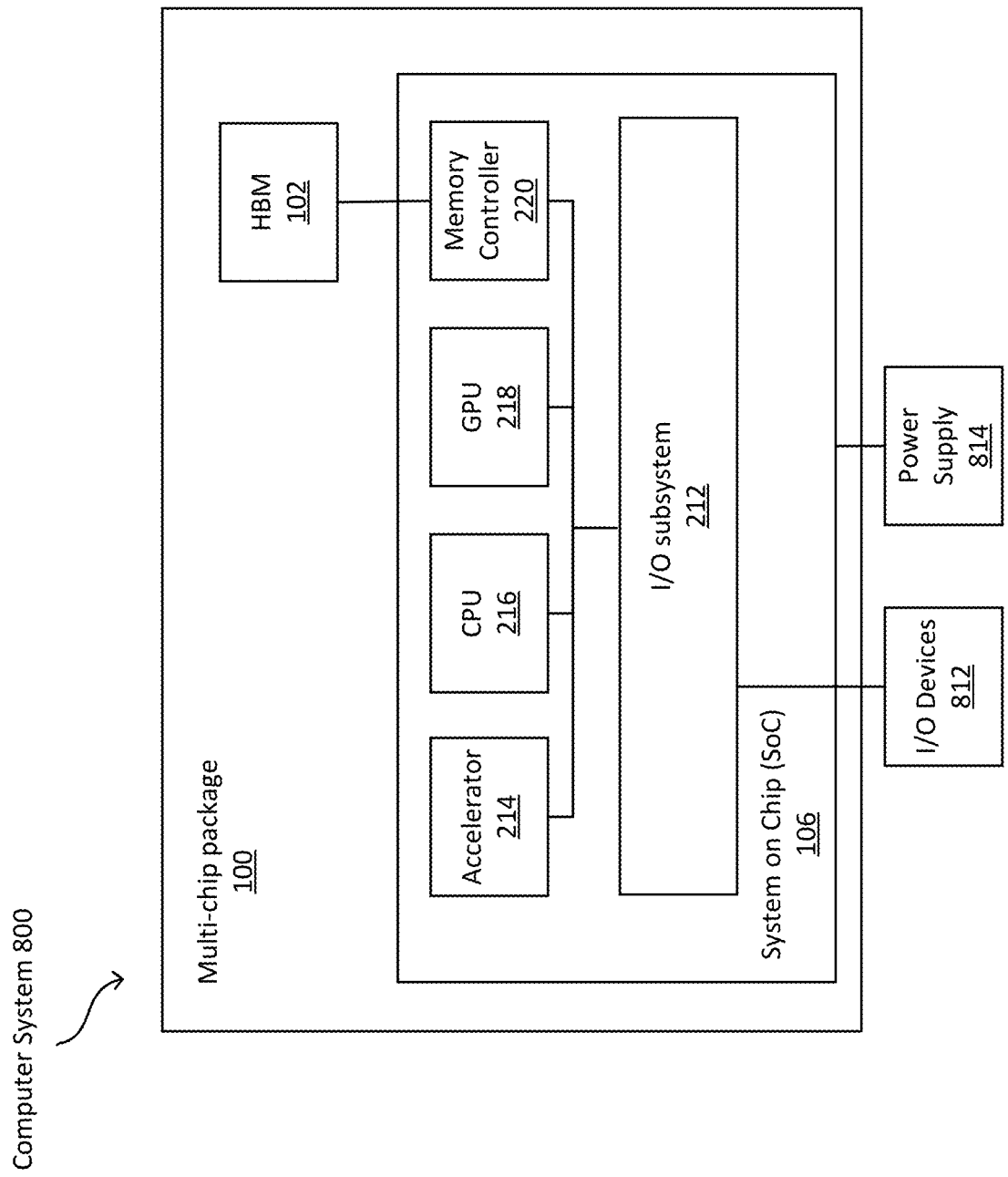
FIG. 8 is a block diagram of an embodiment of a computer system that includes the memory controller to perform per channel throttling techniques.

FIG. 8 is a block diagram of an embodiment of a computer system 800 that includes the memory controller 220 to perform per channel throttling based on channel temperature. Computer system 800 can correspond to a computing device including, but not limited to, a server, a workstation computer, a desktop computer, a laptop computer, a handheld device such as smart phone, and/or a tablet computer.

The computer system 800 includes a multi-chip package 100, input/output (I/O) devices 812, and a power supply 814.

The multi-chip package 100 includes HBM stack 102 and a logic die 106. In one embodiment the logic die 106 is an SoC 200 which includes one or more of an accelerator 214, at least one Central Processing Unit (CPU) 216, a memory controller 220, and a Graphics Processor Unit (GPU) 218.

Power supply 814 provides power to the components of system 800. More specifically, power supply 814 typically interfaces to one or multiple power supplies in system 800 to provide power to the components of system 800. In one example, power supply 814 includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply 814 includes wireless charging hardware to charge via proximity to a charging field. In one example, power source can include an internal battery or fuel cell source.

Examples of per channel thermal management follow.

Example 1: A memory controller including: input/output (I/O) circuitry to receive channel temperature information from a plurality of stacked memory dies, the channel temperature information to indicate a temperature of a channel of a memory die of the plurality of stacked memory dies, and circuitry to: throttle row commands to the channel at a first rate based on the channel temperature information, and throttle column commands to the channel at a second rate based on the channel temperature information.

Example 2: The memory controller of example 1, wherein: the first rate is based on a ratio of alternating on-time to off-time of a row command throttling signal for the channel, and the second rate is based on a second ratio of alternating on-time to off-time for a column command throttling signal for the channel.

Example 3: The memory controller of any of examples 1 or 2, wherein: the on-time of the row command throttling signal indicates a number of clock cycles in which row commands to the channel are disabled, and the off-time of the row command throttling signal indicates a number of clock cycles in which row commands to the channel are enabled.

Example 4: The memory controller of any of examples 1-3, wherein: the on-time of the column command throttling signal indicates a number of clock cycles in which column commands to the channel are disabled, and the off-time of the column command throttling signal indicates a number of clock cycles in which column commands to the channel are enabled.

Example 5: The memory controller of any of examples 1-4, wherein: the ratio of alternating on-time to off-time of the row command throttling signal 50:50, and the ratio of alternating on-time to off-time of the column command throttling signal is greater than the ratio of alternating on-time to off-time of the row command throttling signal.

Example 6: The memory controller of any of examples 1-5, wherein: the first rate is based on a window of time in which the row commands to the channel are disabled, and the second rate is based on a second window of time in which the column commands to the channel are disabled.

Example 7: The memory controller of any of examples 1-6, wherein the circuitry to throttle the row commands and the column commands is to: throttle the row commands to the channel at the first rate which is different than the second rate at which column commands are to be throttled.

Example 8: The memory controller of any of examples 1-7, wherein: the first rate is greater than the second rate.

Example 9: The memory controller of any of examples 1-8, wherein: the channel includes a plurality of pseudo channels, and the circuitry is to throttle the row commands to the plurality of pseudo channels at the first rate, and the circuitry is to throttle the column commands to the plurality of pseudo channels at the second rate.

Example 10: The memory controller of any of examples 1-9, wherein: the first rate is based on a ratio of alternating on-time to off-time of a row command throttling signal to the plurality of pseudo channels, and the alternating on-time to off-time is staggered across the plurality of pseudo channels.

Example 11: The memory controller of any of examples 1-10, wherein: the circuitry is to throttle second row commands to a second channel of the memory die at a third rate, and the circuitry is to throttle second column commands to the second channel of the memory die at a fourth rate.

Example 12: The memory controller of any of examples 1-11, wherein: each memory die of the plurality of stacked memory dies includes a plurality of channel temperature sensors, and the channel temperature information is to indicate a plurality of temperatures from the plurality of channel temperature sensors.

Example 13: The memory controller of any of examples 1-12, wherein: the channel temperature information is to indicate a channel junction temperature.

Example 14: A system including: a multi-chip device including: a stack of memory dies, each of the memory dies of the stack including a plurality of channels, and a logic die coupled with the stack of memory dies, the logic die including a memory controller, the memory controller including: circuitry to: receive channel temperature information to indicate a temperature of a channel of one of the memory dies of the stack, throttle row commands to the channel at a first rate based on the channel temperature information, and throttle column commands to the channel at a second rate based on the channel temperature information.

Example 15: The system of example 14, wherein: the first rate is based on a ratio of alternating on-time to off-time of a row command throttling signal for the channel, and the second rate is based on a second ratio of alternating on-time to off-time for a column command throttling signal for the channel.

Example 16: The system of any of examples 14 or 15, wherein: the on-time of the row command throttling signal indicates a number of clock cycles in which row commands to the channel are disabled, and the off-time of the row command throttling signal indicates a number of clock cycles in which row commands to the channel are enabled.

Example 17: The system of any of examples 14-16, wherein: the on-time of the column command throttling signal indicates a number of clock cycles in which column commands to the channel are disabled, and the off-time of the column command throttling signal indicates a number of clock cycles in which column commands to the channel are enabled.

Example 18: The system of any of examples 14-17, further including: one or more of: a display and a power source.

Example 19: The system of any of examples 14-18, wherein the memory controller is in accordance with any of examples 2-13.

Example 20: A method including: receiving channel temperature information from a plurality of stacked memory dies, the channel temperature information to indicate a temperature of a channel of a memory die of the plurality of stacked memory dies, throttling row commands to the channel at a first rate based on the channel temperature information, and throttling column commands to the channel at a second rate based on the channel temperature information.

Example 21: The method of example 20, wherein: the first rate is based on a ratio of alternating on-time to off-time of a row command throttling signal for the channel, and the second rate is based on a second ratio of alternating on-time to off-time for a column command throttling signal for the channel.

Example 22: The method of any of example 20 or 21, wherein the memory controller is in accordance with any of examples 1-13.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). The hardware design embodiments discussed above may be embodied within a semiconductor chip and/or as a description of a circuit design for eventual targeting toward a semiconductor manufacturing process. In the case of the later, such circuit descriptions may take of the form of a (e.g., VHDL or Verilog) register transfer level (RTL) circuit description, a gate level circuit description, a transistor level circuit description or mask description or various combinations thereof. Circuit descriptions are typically embodied on a computer readable storage medium (such as a CD-ROM or other type of storage technology).

A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller comprising:
input/output (I/O) circuitry to receive channel temperature information from a plurality of stacked memory dies, the channel temperature information to indicate a temperature of a channel of a memory die of the plurality of stacked memory dies; and
circuitry to:
throttle row commands to the channel at a first rate based on the channel temperature information, and throttle column commands to the channel at a second rate based on the channel temperature information.

2. The memory controller of claim 1, wherein:
the first rate is based on a first ratio of alternating on-time to off-time of a row command throttling signal for the channel; and
the second rate is based on a second ratio of alternating on-time to off-time for a column command throttling signal for the channel.

3. The memory controller of claim 2, wherein:
the on-time of the row command throttling signal indicates a first number of first clock cycles in which the row commands to the channel are disabled; and
the off-time of the row command throttling signal indicates a second number of second clock cycles in which the row commands to the channel are enabled.

4. The memory controller of claim 3, wherein:
the on-time of the column command throttling signal indicates a third number of third clock cycles in which the column commands to the channel are disabled; and
the off-time of the column command throttling signal indicates a fourth number of fourth clock cycles in which the column commands to the channel are enabled.

5. The memory controller of claim 2, wherein:
The first ratio of alternating on-time to off-time of the row command throttling signal is 50:50; and
the second ratio of alternating on-time to off-time of the column command throttling signal is greater than the first ratio of alternating on-time to off-time of the row command throttling signal.

6. The memory controller of claim 1, wherein:
the first rate is based on a first window of time in which the row commands to the channel are disabled; and
the second rate is based on a second window of time in which the column commands to the channel are disabled.

7. The memory controller of claim 1, wherein the circuitry to throttle the row commands and the column commands is to:
throttle the row commands to the channel at the first rate which is different than the second rate at which column commands are to be throttled.

8. The memory controller of claim 1, wherein:
the first rate is greater than the second rate.

9. The memory controller of claim 1, wherein:
the channel includes a plurality of pseudo channels,
the circuitry is to throttle the row commands to the plurality of pseudo channels at the first rate, and
the circuitry is to throttle the column commands to the plurality of pseudo channels at the second rate.

10. The memory controller of claim 9, wherein:
the first rate is based on a ratio of alternating on-time to off-time of a row command throttling signal to the plurality of pseudo channels; and
the alternating on-time to off-time is staggered across the plurality of pseudo channels.

11. The memory controller of claim 1, wherein:
the circuitry is to throttle second row commands to a second channel of the memory die at a third rate; and
the circuitry is to throttle second column commands to the second channel of the memory die at a fourth rate.

12. The memory controller of claim 1, wherein:
each memory die of the plurality of stacked memory dies includes a plurality of channel temperature sensors; and
the channel temperature information is to indicate a plurality of temperatures from the plurality of channel temperature sensors.

13. The memory controller of claim 1, wherein:
the channel temperature information is to indicate a channel junction temperature.

14. A system comprising:
a multi-chip device comprising:
  a stack of memory dies, each of the memory dies of the stack including a plurality of channels; and
  a logic die coupled with the stack of memory dies, the logic die including a memory controller, the memory controller including:
    circuitry to:
      receive channel temperature information to indicate a temperature of a channel of one of the memory dies of the stack,
      throttle row commands to the channel at a first rate based on the channel temperature information, and
      throttle column commands to the channel at a second rate based on the channel temperature information.

15. The system of claim 14, wherein:
the first rate is based on a first ratio of alternating on-time to off-time of a row command throttling signal for the channel; and
the second rate is based on a second ratio of alternating on-time to off-time for a column command throttling signal for the channel.

16. The system of claim 15, wherein:
the on-time of the row command throttling signal indicates a first number of first clock cycles in which the row commands to the channel are disabled; and
the off-time of the row command throttling signal indicates a second number of second clock cycles in which the row commands to the channel are enabled.

17. The system of claim 16, wherein:
the on-time of the column command throttling signal indicates a third number of third clock cycles in which the column commands to the channel are disabled; and
the off-time of the column command throttling signal indicates a fourth number of fourth clock cycles in which the column commands to the channel are enabled.

18. The system of claim 14, further comprising:
one or more of: a display and a power source.

19. A method comprising:
receiving channel temperature information from a plurality of stacked memory dies, the channel temperature information to indicate a temperature of a channel of a memory die of the plurality of stacked memory dies;
throttling row commands to the channel at a first rate based on the channel temperature information; and
throttling column commands to the channel at a second rate based on the channel temperature information.

20. The method of claim 19, wherein:
the first rate is based on a first ratio of alternating on-time to off-time of a row command throttling signal for the channel; and
the second rate is based on a second ratio of alternating on-time to off-time for a column command throttling signal for the channel.

* * * * *